(12) United States Patent
Chen et al.

(10) Patent No.: US 12,125,864 B2
(45) Date of Patent: *Oct. 22, 2024

(54) IMAGE SENSOR AND METHOD OF MAKING

(71) Applicant: TAIWAN SEMICONDUCTOR MANUFACTURING COMPANY LTD., Hsinchu (TW)

(72) Inventors: Po-Han Chen, Hsinchu (TW); Chen-Chun Chen, Hsinchu (TW); Fu-Cheng Chang, Hisnchu (TW); Kuo-Cheng Lee, Hsinch (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/319,159

(22) Filed: May 17, 2023

(65) Prior Publication Data

US 2023/0299104 A1 Sep. 21, 2023

Related U.S. Application Data

(63) Continuation of application No. 16/595,092, filed on Oct. 7, 2019, now Pat. No. 11,676,980.
(Continued)

(51) Int. Cl.
*H01L 27/146* (2006.01)

(52) U.S. Cl.
CPC .. *H01L 27/14623* (2013.01); *H01L 27/14605* (2013.01); *H01L 27/14685* (2013.01)

(58) Field of Classification Search
None
See application file for complete search history.

(56) References Cited

U.S. PATENT DOCUMENTS 10,811,453 B1 10/2020 Mun et al.
11,676,980 B2 * 6/2023 Chen ................. H01L 27/14605
257/435
(Continued)

FOREIGN PATENT DOCUMENTS

CN 1435876 8/2003
CN 1716626 1/2006
(Continued)

OTHER PUBLICATIONS

Office Action dated Dec. 20, 2021 from corresponding application No. CN 201911059813.7.
(Continued)

*Primary Examiner* — Benjamin P Sandvik
(74) *Attorney, Agent, or Firm* — Hauptman Ham, LLP

(57) ABSTRACT

A method of making an image sensor includes depositing a shield layer over a substrate, wherein the substrate comprises a first photodiode (PD) and a second PD. The method further includes etching the shield layer to define a first recess aligned with the first PD and a second recess aligned with the second PD. The method further includes depositing a flicker reduction layer in the first recess and in the second recess. The method further includes etching the flicker reduction layer to remove the flicker reduction layer from the first recess.

20 Claims, 7 Drawing Sheets

Related U.S. Application Data

(60) Provisional application No. 62/753,562, filed on Oct. 31, 2018.

(56) References Cited

U.S. PATENT DOCUMENTS

| | | |
|---|---|---|
| 2009/0159875 A1 | 6/2009 | Chabinyc et al. |
| 2011/0215223 A1 | 9/2011 | Unagami et al. |
| 2014/0235008 A1 | 8/2014 | JangJian et al. |
| 2016/0372507 A1 | 12/2016 | Yang et al. |
| 2018/0366513 A1 | 12/2018 | Yang et al. |

FOREIGN PATENT DOCUMENTS

| | | |
|---|---|---|
| CN | 105097855 | 11/2015 |
| CN | 106257679 | 12/2016 |
| CN | 106997884 | 8/2017 |
| CN | 108140661 | 6/2018 |
| CN | 108549121 | 9/2018 |
| JP | 2009272747 | 11/2009 |
| TW | I422019 | 1/2014 |

OTHER PUBLICATIONS

Office Action dated Jun. 15, 2020 from corresponding application No. TW 108138891.

* cited by examiner

IMAGE SENSOR AND METHOD OF MAKING

PRIORITY CLAIM

The present application is a continuation of U.S. application Ser. No. 16/595,092, filed Oct. 7, 2019, which claims the priority of U.S. Provisional Application No. 62/753,562, filed Oct. 31, 2018, which are incorporated herein by reference in their entireties.

BACKGROUND

Complementary metal-oxide-semiconductor (CMOS) image sensors (CIS) are pixelated metal oxide semiconductors. A CIS includes an array of light sensitive picture elements (pixels). Each of pixel includes transistors (switching transistor and reset transistor), capacitors, and a photo-sensitive element (e.g., a photodiode). As the photodiode receives incident light, an electrical charge is induced in the photodiode. Each photodiode generates electrons proportional to the amount of light incident on the pixel. Furthermore, the electrons are converted into a voltage signal in the pixel and further transformed into a digital signal by means of an A/D converter. Periphery circuitry receives the digital signals and process the digital signals to generate an image.

A CMOS image sensor includes additional layers such as dielectric layers and interconnect layers on the substrate. The interconnect layers are used to electrically connect the photodiodes with peripheral circuitry. A side of the substrate having the additional layers is commonly referred to as a front side, while the side of the substrate opposite the additional layers is referred to as a backside. A sensor in which light is received from the front side is called a front-side illumination (FSI) image sensor. A sensor in which light is received form the backside is called a backside illumination (BSI) image sensor.

In a FSI image sensor, light incident on the front side of the CMOS image sensor passes through dielectric layers and interconnect layers, and finally reaches the photodiode. The additional layers (e.g., opaque and reflective metal layers) in the light path limit the amount of light incident on the photodiode so as to reduce quantum efficiency. In contrast, there is no obstruction from additional layers (e.g., metal layers) in a BSI image sensor. Light is incident on the backside of the CMOS image sensor. As a result, light reaches the photodiode through a more direct path. The reduced number of obstructions in the BSI image sensor helps to increase the number of photons from the initial light that is converted into electrons.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
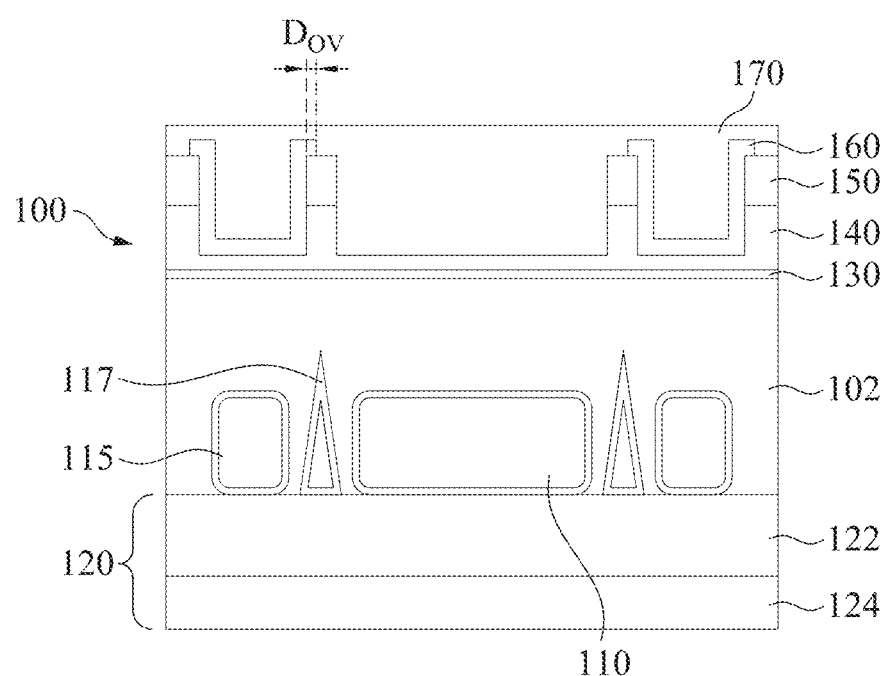
FIG. 1 is a cross-sectional view of an image sensor in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some subject scenes that are captured using a CIS include light sources, such as a light emitting diode (LED). An LED emits light in pulses, rather than continuously. The pulse rate of the LED is faster than can be perceived by the eye, so the LED appears to have a constant light intensity during operation. However, when an image of the LED is captured, the CIS captures light at a faster rate than the human eye. If the pulse rate of the LED does not match the detection rate of the CIS, certain pulses of the LED will not be detected by the CIS. As a result, in some instances the captured image will not accurately reflect the subject scene observed by a user.

In order to reduce discrepancies between the subject scene observed by a user and an image captured by a CIS, the CIS is divided into large photodiodes (LPDs) and small photodiodes (SPDs). The LPDs and SPDs have different capture rates. As a result, the odds of a pulse from the LED being missed by the CIS is reduced. However, due to the wide variety of pulse rates in different light sources, some pulses are still missed even with the LPD and SPD arrangement.

Increasing detection duration for an SPD will further reduce the odds of the CIS missing a pulse from the light source. However, increasing the detection duration for the SPD will increase the risk of the SPD reaching a saturation point during the detection duration. A saturation point is a point at which a maximum amount of electrons have been created by the SPD based on the received light. In order to permit the SPD to convert additional light to electrons, the SPD is discharged and reset. The discharging and resetting are part of a read out process for the CIS. If the saturation point is reached prior to the end of the detection duration, then the image detected by the CIS will not accurately reflect the subject scene observed by the user. In order to permit an increased detection duration while reducing the risk of reaching the saturation point by the end of the detection duration, a second layer is added over the SPDs.

The second layer acts to absorb or reflect some of the incident light, which reduces the amount of light which reaches the SPD to be converted into electrons. As a result, the SPD reaches the saturation point more slowly in comparison with other arrangements. Reaching the saturation point more slowly permits the detection duration of the SPD to increase while maintaining accuracy in the detected image. The increased detection duration also reduces the risk of the CIS failing to capture a pulse from a light source, such as an LED.

FIG. 1 is a cross-sectional view of an image sensor 100 according to some embodiments. Image sensor 100 is a CIS. Image sensor 100 is shown as a BSI image sensor. In some embodiments, image sensor is an FSI image sensor.

Image sensor 100 includes a substrate 102. An LPD is on a backside of the substrate 102. SPDs 115 are arranged on opposite sides of the LPD 110. An isolation structure 117 is between each SPD 115 and the LPD 110. An interconnect structure 120 is on a front side of the substrate 102. The interconnect structure 120 includes an inter-layer dielectric 122 and an inter-metal dielectric (IMD) layer 124. The ILD 122 is between the IMD layer 124 and substrate 102.

An anti-reflective coating (ARC) 130 is on the backside of substrate 102. A first buffer layer 140 is on the ARC 130. First buffer layer 140 is recessed in areas corresponding to LPD 110 and SPDs 115. The recessed portions of first buffer layer 140 reduce the amount of light absorption by the first buffer layer 140 during detection of an image. A shield layer 150 is on non-recessed portions of first buffer layer 140. A flicker reduction layer 160 extends into the recessed portions of first buffer layer 140 corresponding to SPDs 115. The flicker reduction layer 160 covers a bottom surface of the recess in first buffer layer 140. The flicker reduction layer 160 also covers sidewalls of the first buffer layer 140 and the shield layer 150. The flicker reduction layer 160 also includes an overhang portion that extends along a top surface of the shield layer 150 by an overhang distance Dov. A second buffer layer 170 extends over the flicker reduction layer 160, the shield layer 150 and the first buffer layer 140. Second buffer layer 170 fills the recesses of first buffer layer 140 including portions of the recesses corresponding to the SPDs 115 not occupied by flicker reduction layer 160.

In some embodiments, the substrate 102 has a first conductivity. In some embodiments, the substrate 102 is a highly doped p-type substrate. In some embodiments, the substrate 102 includes silicon, germanium, silicon germanium, graded silicon germanium, semiconductor-on-insulator, carbon, quartz, sapphire, glass, or the like. In some embodiments, the substrate 102 is multi-layered (e.g., strained layers). In some embodiments, a lightly doped p-type epitaxial layer (not shown) is grown on a highly doped p-type substrate 102.

The photo active regions are in the substrate 102 and define LPD 110 and SPDs 115. In some embodiments, LPD 110 and SPDs 115 are formed by implanting impurity ions into the substrate 102. In some embodiments, the photo active regions are a PN junction photodiode, a PNP phototransistor, an NPN phototransistor or the like. In some embodiments, the photo active regions include a p-type layer on an n-type region, where the n-type region is formed on an epitaxial layer grown from a p-type semiconductor substrate.

In some embodiments, n-type impurity ions are implanted into the p-type epitaxial layer to form an n-type photo diode region (not shown). In some embodiments, p-type impurity ions are implanted into the n-type photo diode region to form a p-type diode region (not shown). The n-type photo diode region and the p-type photo diode region further form a photo diode region for LPD 110 and SPDs 115.

The substrate 102 includes many pixels. Each pixel includes at least one of LPD 110 or SPD 115. In order to reduce the risk of crosstalk between adjacent pixels, an isolation region 117 is used to separate two adjacent photodiodes. In some embodiments, the isolation region 117 is a shallow trench isolation (STI) structure. In some embodiments, the STI structure is formed by etching a portion of the substrate 102 to form a trench and filling the trench with oxide and/or other dielectric materials.

The ILD 122 is over the front side of the substrate 102. In some embodiments, the ILD 122 includes a low-K dielectric material such as silicon oxide, borophosphosilicate glass (BPSG), phosphosilicate glass (PSG), fluorinated silicate glass (FSG), carbon-doped silicon oxide or the like. In some embodiments, ILD 122 is formed by any suitable techniques such as chemical vapor deposition (CVD) techniques or the like.

IMD 124 is over ILD 122. In some embodiments, the IMD 124 includes a low-K dielectric material such as silicon oxide, borophosphosilicate glass (BPSG), phosphosilicate glass (PSG), fluorinated silicate glass (FSG), carbon-doped silicon oxide or the like. In some embodiments, ILD 122 includes a same material as IMD 124. In some embodiments, ILD 122 includes a different material from IMD 124. In some embodiments, IMD 124 is formed by any suitable techniques such as chemical vapor deposition (CVD) techniques or the like. In some embodiments, ILD 122 is formed using a same process as IMD 124. In some embodiments, ILD 122 is formed using a different process from IMD 124.

Interconnect structure 120 includes a plurality of conductive elements (not shown) in ILD 122 and IMD 124. In some embodiments, ILD 122 and IMD 124 are patterned by plasma etching or a damascene process and conductive elements are formed of any conductive material suitable for the particular application. Suitable materials include, for example, aluminum, copper, doped polysilicon or the like. Conductive elements of interconnect structure 120 provide electrical connectivity between different components of image sensor 100.

The ARC 130 is on the backside of substrate 102. In some embodiments, the ARC 130 includes dielectric materials such as silicon oxide, silicon nitride, silicon oxynitride, hafnium oxide, tantalum oxide, or a combination thereof, although other materials may be used. In some embodiments, the ARC 130 is formed using atomic layer deposition (ALD), CVD, PECVD, physical vapor deposition (PVD), metal-organic chemical vapor deposition (MOCVD), or the like. In some embodiments in which the ARC 130 includes an oxide layer, a low-temperature remote plasma-assisted oxidation (LRPO) process may be used to form the ARC 130. The ARC 130 is used to reduce a reflection of incident light from the backside of image sensor 100.

In some embodiments, the ARC 130 includes a multi-layer structure. In some embodiments, the ARC 130 includes an $HfO_2$ layer having a thickness between about 20 Å and about 150 Å, and a $Ta_2O_5$ layer having a thickness between about 350 Å and about 800 Å, where $Ta_2O_5$ layer is over the HfO$_2$ layer. If the thickness of the ARC 130 is too great too much incident light will be absorbed prior to reaching LPD 110 or SPDs 115, in some instances. If the thickness of the ARC 130 is too small the ARC will not provide sufficient anti-reflective properties for image sensor 100 and light may be reflected back into LPD 110 or SPDs 115, in some instances.

First buffer layer 140 is over ARC 130. In some embodiments, the first buffer layer 140 includes silicon oxide, for example, although other dielectric materials may be used. In some embodiments, the first buffer layer 140 is formed using atomic layer deposition (ALD), CVD, plasma-enhanced CVD (PECVD), or a combination thereof. In some embodiments in which the first buffer layer 140 includes an oxide layer, low-temperature remote plasma-assisted oxidation (LRPO) is used to form the first buffer layer 140. In some embodiments, the first buffer layer 140 is a plasma enhanced oxide (PEOX) layer. In some embodiments, the first buffer layer 140 is planarized using a grinding process, a chemical mechanical polishing (CMP) process, an etching process, or the like. After the planarization process, the first buffer layer 140 has a thickness ranging from about 250 Å and about 2500 Å according to some embodiments. If the thickness of the first buffer layer 140 is too great too much incident light will be absorbed prior to reaching LPD 110 or SPDs 115, in some instances. If the thickness of the first buffer layer 140 is too small a risk of etching through the first buffer layer 140 into ARC 130 during the creation of the recesses is increased, in some instances.

Shield layer 150 is over the first buffer layer 140. In some embodiments, an adhesion layer (not shown) is between shield layer 150 and the first buffer layer 140. In some embodiments, the adhesion layer includes titanium, titanium nitride, tantalum, tantalum nitride, or multilayers thereof and is formed using CVD, PVD, MOCVD, or the like. In some embodiments, a thickness of the adhesion layer ranges from about 50 Å and about 500 Å. If the thickness of the adhesion layer is too great too much material is wasted and a size of image sensor 100 is increased without significant improvement in functionality, in some instances. If the thickness of the adhesion layer is too small a risk of separation of the shield layer 150 and the first buffer layer 140 is increased, in some instances.

In some embodiments, shield layer 150 includes aluminum, copper, nickel, tungsten, alloys thereof, or the like. In some embodiments, shield layer 150 includes a dielectric material, such as silicon oxynitride, or the like. In some embodiments, shield layer 150 is formed using CVD, PVD, plating, or the like. In some embodiments, a thickness of shield layer 150 ranges from about 500 Å and about 3500 Å. If the thickness of the shield layer 150 is too great too much material is wasted and a size of image sensor 100 is increased without significant improvement in functionality, in some instances. If the thickness of the shield layer 150 is too small a risk of crosstalk between pixels is increased, in some instances.

Flicker reduction layer 160 is over the shield layer 150. In some embodiments, flicker reduction layer 160 includes a metallic material or a dielectric material. In some embodiments, flicker reduction layer 160 includes TaN, TiN, SiON or another suitable material. In some embodiments, flicker reduction layer 160 includes a same material as shield layer 150. In some embodiments, flicker reduction layer 160 includes a different material from shield layer 150. In some embodiments, flicker reduction layer 160 is a single layer structure. In some embodiments, flicker reduction layer 160 includes a multi-layer structure. In some embodiments, each layer of the multi-layer structure is a same material. In some embodiments, at least one layer of the multi-layer structure is different from another layer of the multi-layer structure. In some embodiments, flicker reduction layer 160 is formed using CVD, PVD, plating, or the like. In some embodiments, flicker reduction layer 160 is formed using a same process as shield layer 150. In some embodiments, flicker reduction layer 160 is formed using a different process from shield layer 150.

Metallic materials have a greater light blocking capability than dielectric materials, so flicker reduction layer 160 is thinner when a metallic material is used. In some embodiments where flicker reduction layer 160 is a dielectric material, a thickness of flicker reduction layer 160 ranges from about 600 Å and about 2000 Å. In some embodiments where flicker reduction layer 160 is a metallic material, a thickness of flicker reduction layer 160 ranges from about 200 Å and about 800 Å. If the thickness of the flicker reduction layer 160 is too great too much of the incident light will be blocked by flicker reduction layer 160, in some instances. If the thickness of the shield layer 150 is too small flicker reduction layer 160 does not sufficiently block incident light to permit a longer detection duration for SPDs 115, in some instances.

Flicker reduction layer 160 has an overhang that extends along a top surface of shield layer 150. The overhang helps to block incident light from an oblique angle from causing SPDs 115 to reach the saturation point prior to the end of the detection duration. In some embodiments, an overhang distance Dov that flicker reduction layer 160 extends along the shield layer 150 ranges from about 50 Å and about 150 Å. In some embodiments, a Dov on a first side of the flicker reduction layer 160 is different from a Dov on a second side of the flicker reduction layer 160. In some embodiments, a Dov for the flicker reduction layer 160 is the same on both sides of the flicker reduction layer 160. If the overhand distance Dov is too small then flicker reduction layer 160 does not sufficiently block oblique incident light from reaching SPDs 115, in some instances. If the overhang distance Dov is too great, then a risk of blocking incident light to be detected by LPD 110 increases, in some embodiments.

Second buffer layer 170 is over flicker reduction layer 160 and shield layer 150 and fills the recesses in first buffer layer 140. In some embodiments, the second buffer layer 170 includes silicon oxide, for example, although other dielectric materials may be used. In some embodiments, second buffer layer 170 includes a same material as first buffer layer 150. In some embodiments, second buffer layer 170 includes a different material from first buffer layer 150. In some embodiments, the second buffer layer 170 is formed using atomic layer deposition (ALD), CVD, plasma-enhanced CVD (PECVD), or a combination thereof. In some embodiments, second buffer layer 170 is formed using same process as first buffer layer 150. In some embodiments, second buffer layer 170 is formed using a different process from first buffer layer 150. In some embodiments in which the second buffer layer 170 includes an oxide layer, low-temperature remote plasma-assisted oxidation (LRPO) is used to form the second buffer layer 170. In some embodiments, the second buffer layer 170 is a plasma enhanced oxide (PEOX) layer. The second buffer layer 170 is planarized using a grinding process, a chemical mechanical polishing (CMP) process, an etching process, or the like. In some embodiments, after the planarization process, the second buffer layer 170 has a thickness ranging from about 2000 Å and about 5000 Å. If the thickness of the second buffer layer 170 is too great too much incident light will be absorbed prior to reaching LPD 110 or SPDs 115, in some instances. If the thickness of the second buffer layer 170 is too small a risk of completing filling the recesses in first buffer layer 140 is increased, in some instances.

In some embodiments, additional elements such as color filters or a lens array is over second buffer layer 170. The color filters are used to selective pass light of a specific wavelength in order to capture colors of a subject scene. The lens array helps to focus incident light toward LPD 110 and SPDs 115.

Figure 2:
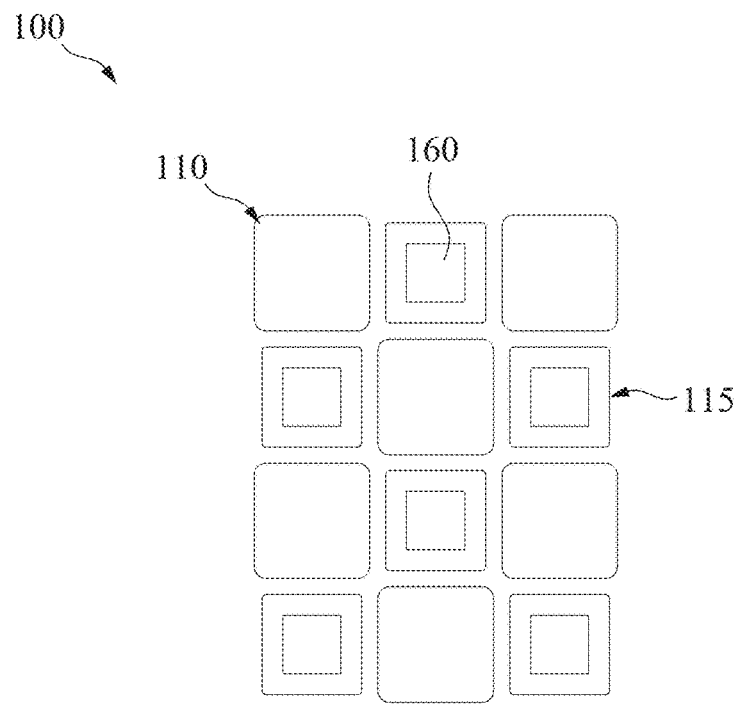
FIG. 2 is a top view of an image sensor in accordance with some embodiments.

FIG. 2 is a top view of image sensor 100 according to some embodiments. Image sensor 100 includes LPDs 110 and SPDs 115 in an alternating array. That is, each LPD 110 is bordered in the X-direction and Y-direction by an SPD 115. Similarly, each SPD 115 is bordered in the X-direction and Y-direction by an LPD 110. In some embodiments, image sensor includes a different arrangement of LPDs 110 and SPDs 115. A size of SPD 115 is less than LPD 110. Flicker reduction layer 160 extends over the entire SPD 115.

Figure 3:
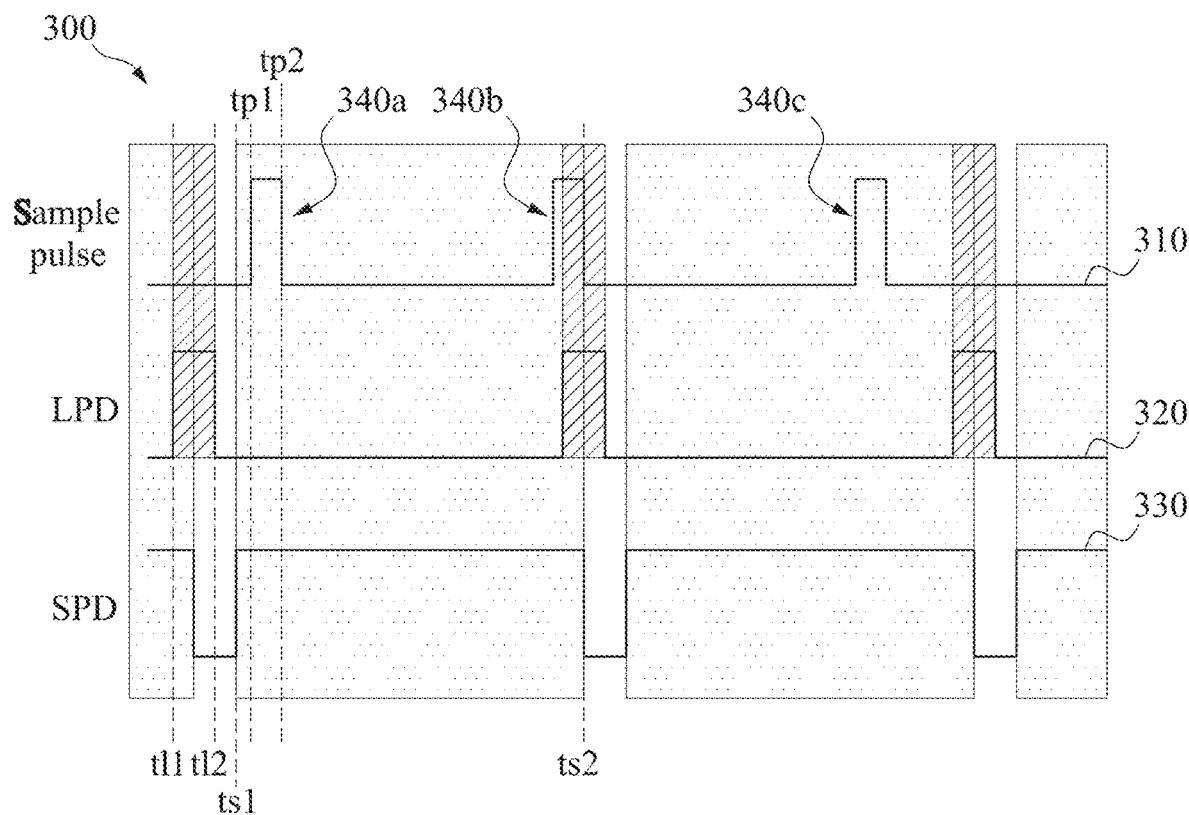
FIG. 3 is a timing diagram for an image sensor and a sample pulse according to some embodiments.

FIG. 3 is a timing diagram 300 for an image sensor and a sample pulse according to some embodiments. The image sensor includes LPDs and SPDs. A flicker reduction layer is over each SPD of the image sensor. In some embodiments, the image sensor is image sensor 100 (FIGS. 1 and 2). Timing diagram 300 includes a sample pulse 310. Timing diagram further includes a detection duration 320 for an LPD. Timing diagram further includes a detection duration 330 for an SPD.

Sample pulse 310 indicates a duration during which a light source, such as an LED, is active. Light is output from the light source when the sample pulse 310 is logically high. A first output in sample pulse 310 begins at time tp1 and ends at time tp2. The timings for the other outputs in sample pulse 310 are not labeled in timing diagram 300 for the sake of simplicity. In some embodiments, sample pulse 310 has a frequency of about 90 Hertz (Hz) to about 300 Hz.

In order for the image sensor to detect the output of the light source associated with sample pulse 310, at least one of the detection duration 320 for LPD or the detection duration 330 for SPD must overlap with an output of sample pulse 310. The detection duration 320 of LPD is when the timing diagram for LPD is logically high. The detection duration 320 for LPD begins at a time t11 and ends at a time t12. The LPD cannot be constantly detecting incident light because the image sensor must read out the electrical signal in the LPD and reset the LPD, as described above.

The detection duration 330 of SPD is when the timing diagram for SPD is logically high. The detection duration 330 for SPD begins at a time ts1 and ends at a time ts2. The SPD cannot be constantly detecting incident light because the image sensor must read out the electrical signal in the SPD and reset the SPD, as described above.

The detection duration 330 of SPD is increased due to the inclusion of a flicker reduction layer over the SPDs of the image sensor for timing diagram 300. In other approaches that do not have the flicker reduction layer, the detection duration is shorter than timing diagram 300 because the SPDs reach a saturation point faster. By increasing the detection duration 330 of SPD, the odds of detecting the output of sample pulse 310 is increased. When the image sensor is able to detect all of the outputs of sample pulse 310, then the image sensor is able to accurately reproduce a subject scene as seen by a user.

Figure 4:
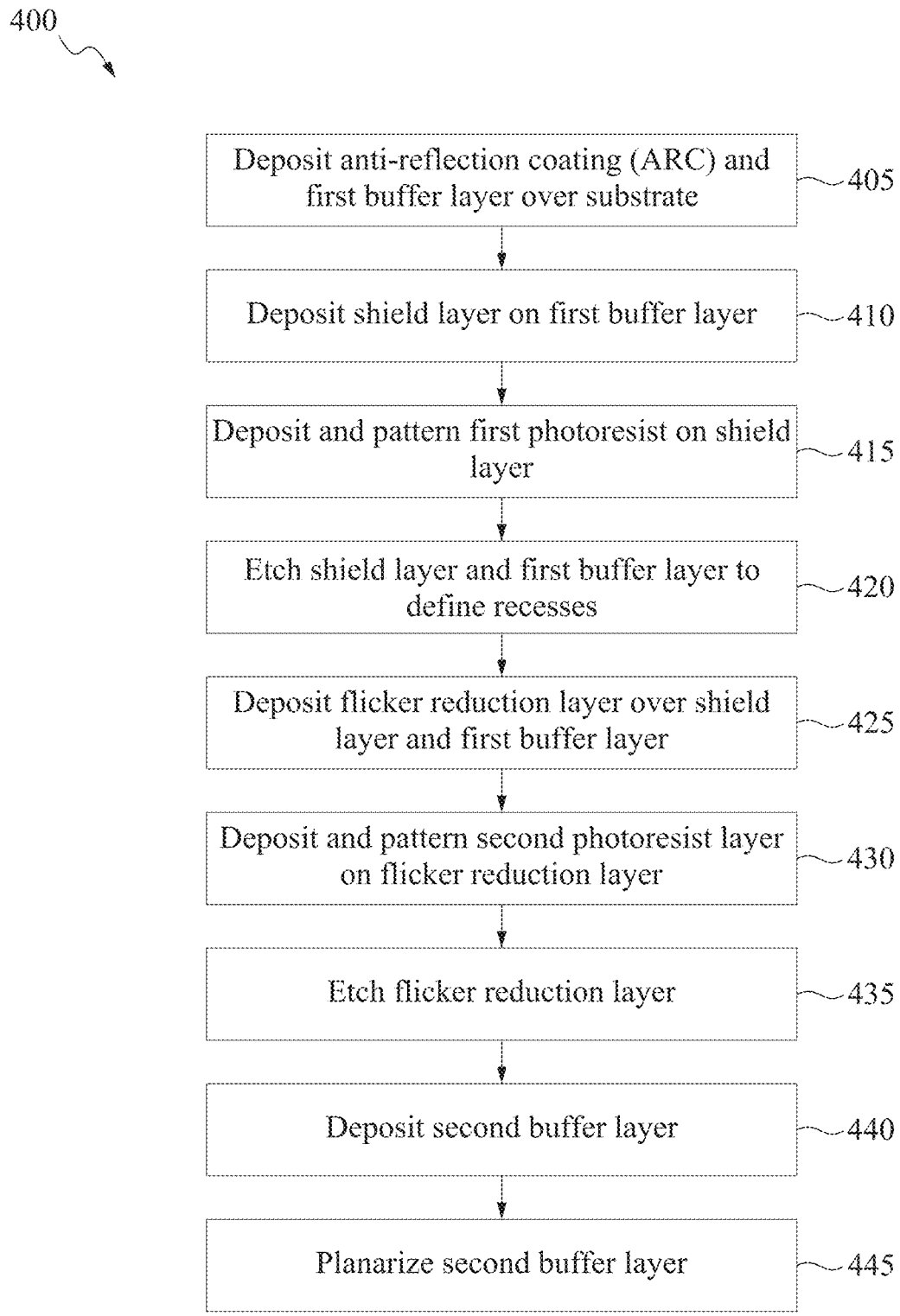
FIG. 4 is a flowchart of a method of making an image sensor according to some embodiments.

FIG. 4 is a flowchart of a method 400 of making an image sensor according to some embodiments. In operation 405, an ARC and a first buffer layer are deposited on a substrate. In some embodiments where the image sensor is a BSI, the ARC and the first buffer layer are deposited on the backside of the substrate. In some embodiments where the image sensor is an FSI, the ARC and first buffer layer are deposited on a front side of the substrate. In some embodiments, the ARC includes dielectric materials such as silicon oxide, silicon nitride, silicon oxynitride, hafnium oxide, tantalum oxide, or a combination thereof. In some embodiments, the ARC is formed using atomic layer deposition (ALD), CVD, PECVD, physical vapor deposition (PVD), metal-organic chemical vapor deposition (MOCVD), or the like. In some embodiments, a low-temperature remote plasma-assisted oxidation (LRPO) process may be used to form the ARC.

In some embodiments, the first buffer layer includes silicon oxide, for example, although other dielectric materials may be used. In some embodiments, the first buffer layer is formed using atomic layer deposition (ALD), CVD, plasma-enhanced CVD (PECVD), or a combination thereof. In some embodiments, low-temperature remote plasma-assisted oxidation (LRPO) is used to form the first buffer layer. In some embodiments, the first buffer layer is a plasma enhanced oxide (PEOX) layer. In some embodiments, following deposition of the first buffer layer, the first buffer layer is planarized using a grinding process, a chemical mechanical polishing (CMP) process, an etching process, or the like.

Figure 5A:
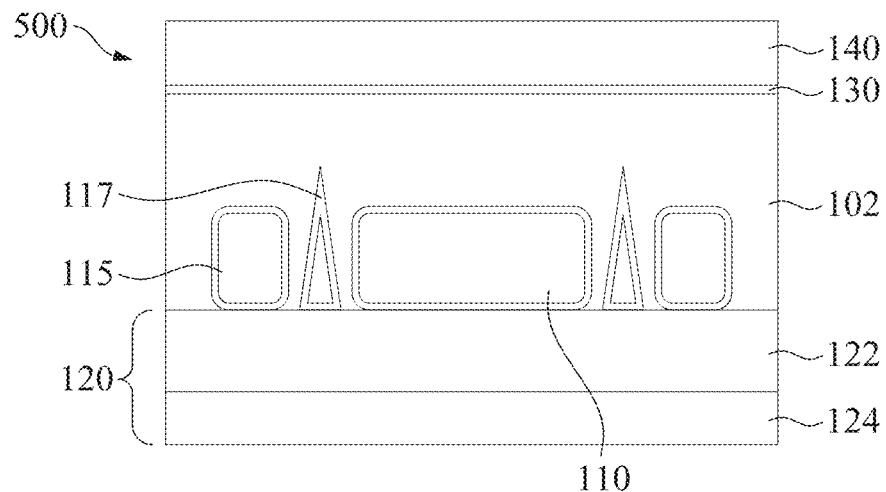
FIGS. 5A-5H are cross-sectional views of an image sensor during various stages of production according to some embodiments.

FIG. 5A is a cross-sectional view of an image sensor 500 following operation 405 according to some embodiments. Reference numbers in FIGS. 5A-5H that match reference numbers from FIG. 1 denote the same element and the description is not repeated for the sake of brevity. Image sensor 500 is a BSI image sensor. In some embodiments, image sensor 500 is an FSI image sensor. Image sensor includes interconnect structure 120, including ILD 122 and IMD 124, in the front side of the substrate 102. ARC 130 and first buffer layer 140 are on the backside of substrate 102. A top surface of the first buffer layer 140 has been planarized.

Returning to FIG. 4, in operation 410, a shield layer is deposited on the first buffer layer. In some embodiments, the shield layer includes aluminum, copper, nickel, tungsten, alloys thereof, or the like. In some embodiments, the shield layer includes a dielectric material, such as silicon oxynitride, or the like. In some embodiments, the shield layer is formed using CVD, PVD, plating, or the like. In some embodiments, an adhesion layer is deposited over the first buffer layer prior to depositing the shield layer.

Figure 5B:
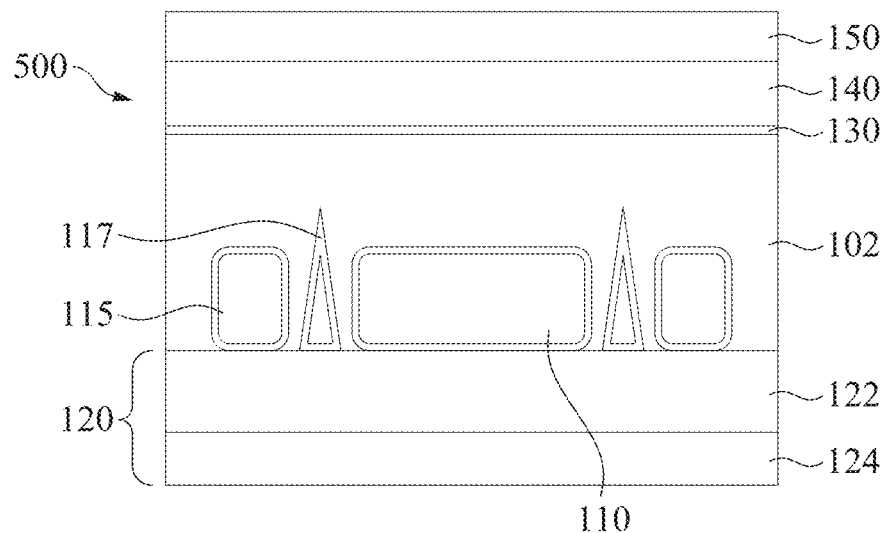

FIG. 5B is a cross-sectional view of an image sensor 500 following operation 410 according to some embodiments. Shield layer 150 is on first buffer layer 140. An adhesion layer is not shown in FIG. 5B. Shield layer 150 extends across the entirety of image sensor 500.

Returning to FIG. 4, in operation 415 a first photoresist (PR) is deposited on the shield layer and patterned. In some embodiments, a hard mask is used in addition to the first PR. In some embodiments, the first PR is a positive photoresist material. In some embodiments, the first PR is a negative photoresist material. In some embodiments, the first PR is patterned by exposing a photosensitive material to light. The photosensitive material is cured and developed to remove exposed (or unexposed) portions of the photosensitive material. In some embodiments that include a hard mask, the hard mask is patterned using suitable photolithography and etching processes. The patterned first PR exposes portions of the shield layer and first buffer layer that will be removed to define the recesses that correspond to the SPD and LPD.

Figure 5C:
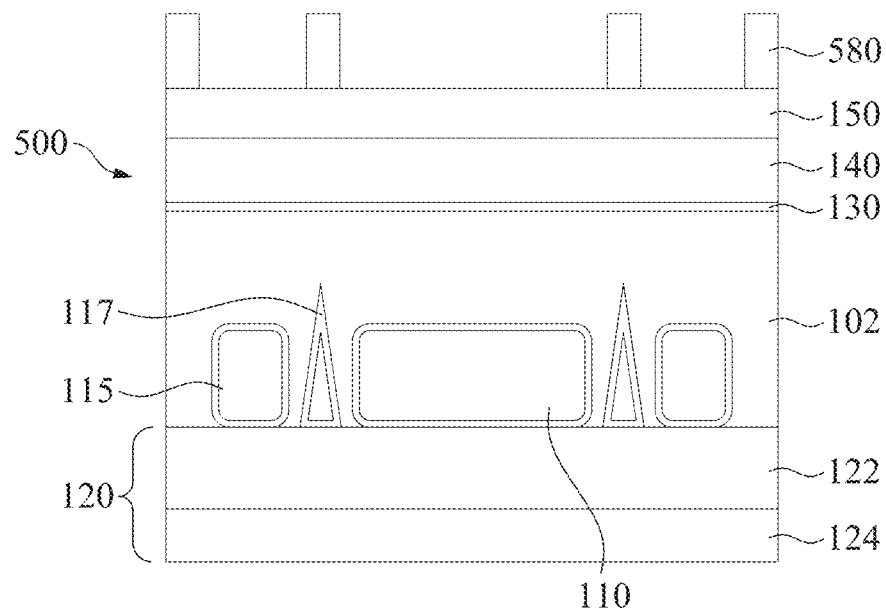

FIG. 5C is a cross-sectional view of an image sensor 500 following operation 415 according to some embodiments. Patterned first PR 580 is on shield layer 150. Patterned first PR 580 exposes portions of the shield layer 150 that are aligned with SPDs 115 and LPD 110.

Returning to FIG. 4, in operation 420 the shield layer and the first buffer layer are etched to define recesses aligned with SPDs and LPDs of the image sensor. In some embodiments, the shield layer and the first buffer layer are etched using a suitable wet etching process. In some embodiments, the shield layer and the first buffer layer are etched using a suitable dry etching process. In some embodiments, the etching process consumes the first PR. In some embodiments, a separate process is used to remove the residual first PR following the etching process. In some embodiments, the residual first PR is removed using an ashing process.

Figure 5D:
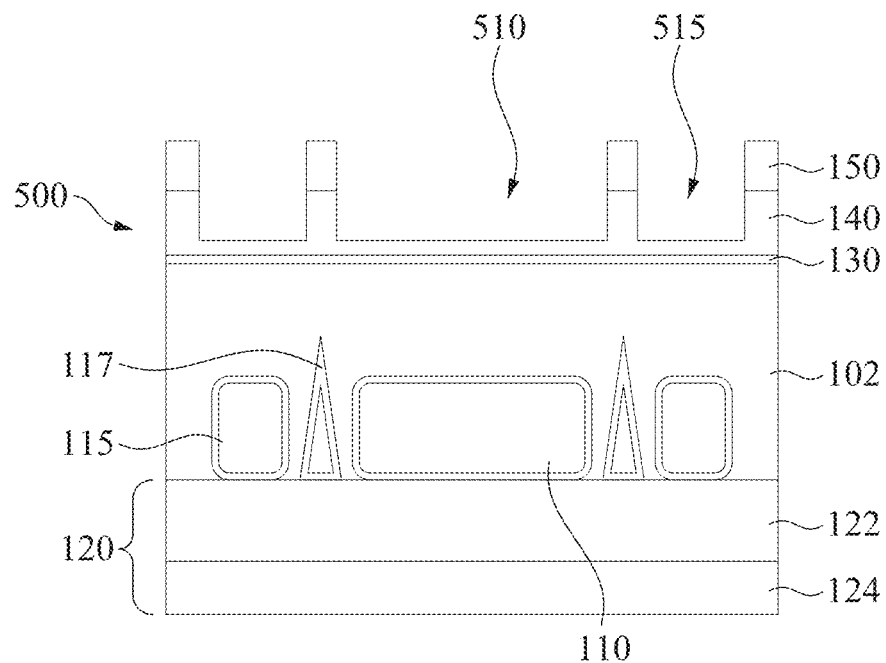

FIG. 5D is a cross-sectional view of an image sensor 500 following operation 420 according to some embodiments. Recesses 510 and 515 are defined in shield layer 150 and first buffer layer 140. Recess 510 is aligned with LPD 110. Recesses 515 are aligned with SPDs 115. First PR 580 has been removed from image sensor 500.

Returning to FIG. 4, in operation 425, a flicker reduction layer is deposited on the shield layer and the first buffer layer. The flicker reduction layer is deposited across the entire surface of the image sensor. In some embodiments, the flicker reduction layer includes a metallic material or a dielectric material. In some embodiments, the flicker reduction layer includes TaN, TiN, SiON or another suitable material. In some embodiments, the flicker reduction layer includes a same material as the shield layer. In some embodiments, the flicker reduction layer includes a different material from the shield layer. In some embodiments, the flicker reduction layer is a single layer structure. In some embodiments, the flicker reduction layer includes a multi-layer structure. In some embodiments, each layer of the multi-layer structure is a same material. In some embodiments, at least one layer of the multi-layer structure is different from another layer of the multi-layer structure. In some embodiments, the flicker reduction layer is formed using CVD, PVD, plating, or the like. In some embodiments, the flicker reduction layer is formed using a same process as the shield layer. In some embodiments, the flicker reduction layer is formed using a different process from the shield layer.

Figure 5E:
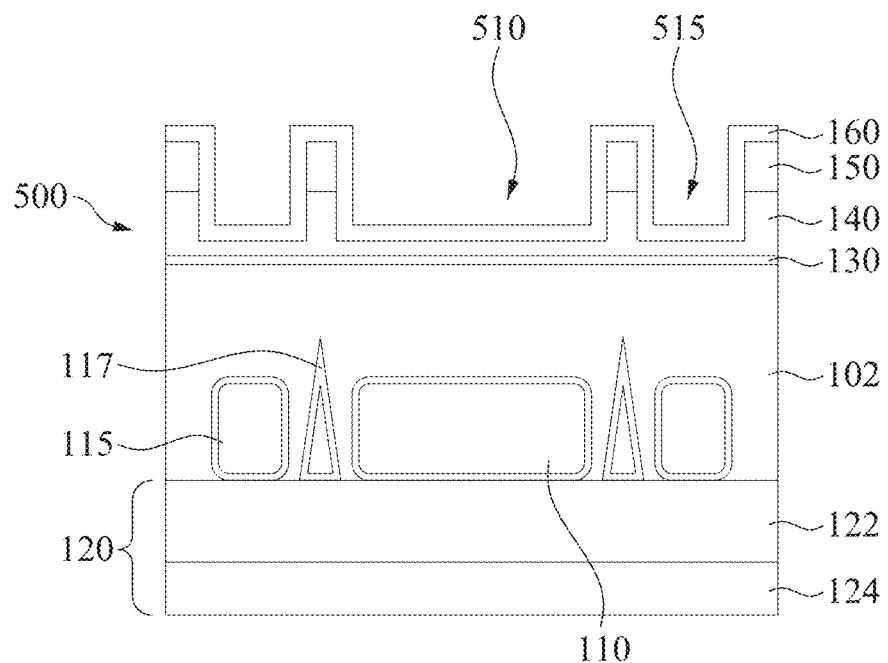

FIG. 5E is a cross-sectional view of an image sensor 500 following operation 425 according to some embodiments. Flicker reduction layer 160 is deposited across the entire surface of image sensor 500. Flicker reduction layer 160 lines the bottom surfaces and sidewalls of recesses 510 and 515.

Returning to FIG. 4, in operation 430 a second PR is deposited on the flicker reduction layer and patterned. In some embodiments, a hard mask is used in addition to the second PR. In some embodiments, the second PR is a positive photoresist material. In some embodiments, the second PR is a negative photoresist material. In some embodiments, a material of the second PR is a same material as the first PR. In some embodiments, a material of the second PR is different from the first PR. In some embodiments, the second PR is patterned by exposing a photosensitive material to light. The photosensitive material is cured and developed to remove exposed (or unexposed) portions of the photosensitive material. In some embodiments that include a hard mask, the hard mask is patterned using suitable photolithography and etching processes. The patterned second PR exposes portions of the flicker reduction layer greater than an overhang distance from the recesses aligned with the SPDs.

Figure 5F:
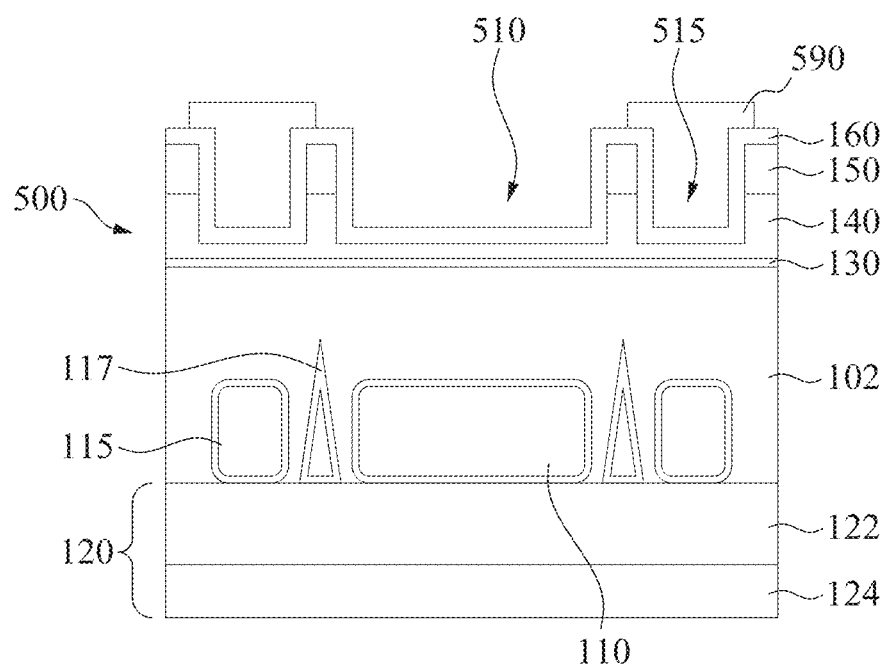

FIG. 5F is a cross-sectional view of an image sensor 500 following operation 430 according to some embodiments. Patterned second PR 590 is on flicker reduction layer 160. Patterned second PR 590 exposes portions of the flicker reduction layer 160 more than an overhang distance Dov from recesses 515.

Returning to FIG. 4, in operation 435 the flicker reduction layer is etched to expose portions of the shield layer more than the overhang distance from the recesses aligned with the SPDs; and to expose the first buffer layer in the recesses aligned with the LPDs. In some embodiments, the flicker reduction layer is etched using a suitable wet etching process. In some embodiments, the flicker reduction layer is etched using a suitable dry etching process. In some embodiments, the etching process in operation 435 is a same etching process as that used in operation 420. In some embodiments, the etching process in operation 435 is different from an etching process used in operation 420. In some embodiments, the etching process consumes the second PR. In some embodiments, a separate process is used to remove the residual second PR following the etching process. In some embodiments, the residual second PR is removed using an ashing process.

Figure 5G:
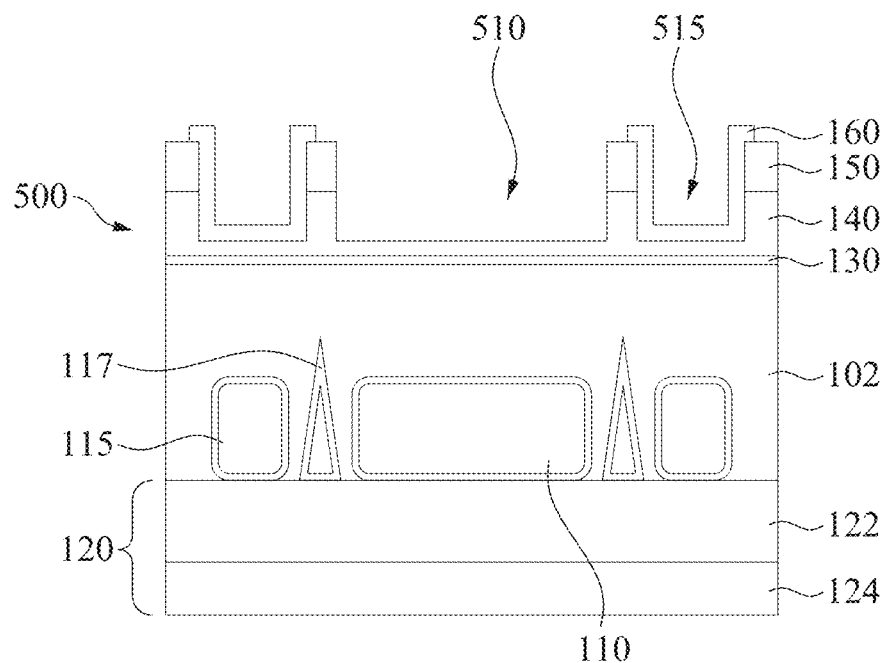

FIG. 5G is a cross-sectional view of an image sensor 500 following operation 435 according to some embodiments. Flicker reduction layer 160 is entirely removed from recess 510. Flicker reduction layer 160 farther from recesses 515 than the overhang distance Dov is removed from the shield layer 150. Second PR 590 has been removed from image sensor 500. In some embodiments, etching the flicker reduction layer 160 includes maintaining a portion of the flicker reduction layer 160 on a top surface of the shield layer 150 and maintaining a portion of the flicker reduction layer 160 in the recess 515.

Returning to FIG. 4, in operation 440 a second buffer layer is deposited. In some embodiments, the second buffer layer includes silicon oxide, for example, although other dielectric materials may be used. In some embodiments, the second buffer layer is formed using atomic layer deposition (ALD), CVD, plasma-enhanced CVD (PECVD), or a combination thereof. In some embodiments, low-temperature remote plasma-assisted oxidation (LRPO) is used to form the second buffer layer. In some embodiments, the second buffer layer is a plasma enhanced oxide (PEOX) layer. In some embodiments, the second buffer layer is formed using a same process as that used to form the first buffer layer. In some embodiments, the second buffer layer is formed using a different process from that used to form the first buffer layer.

Figure 5H:
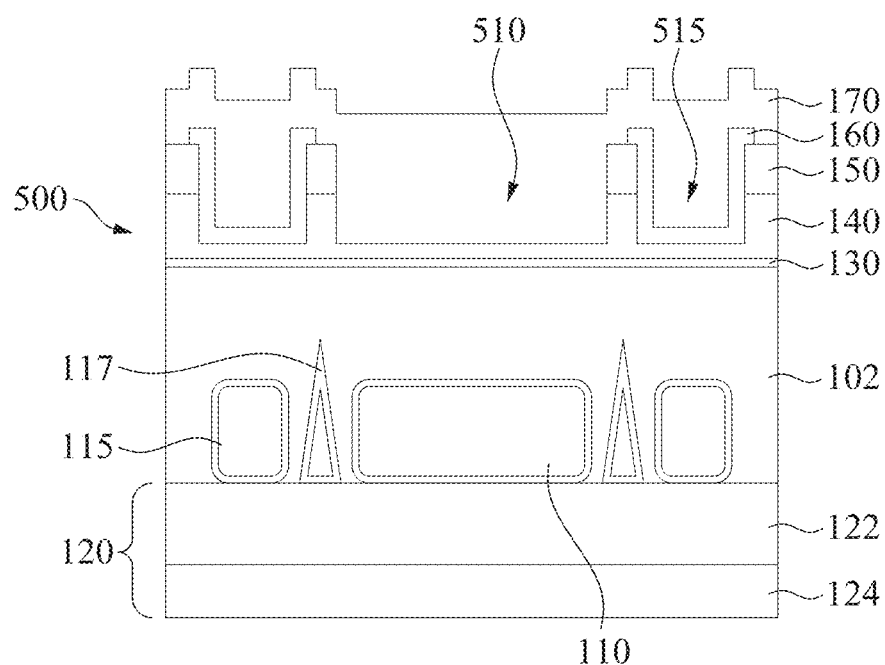

FIG. 5H is a cross-sectional view of an image sensor 500 following operation 440 according to some embodiments. Second buffer layer 170 extends over the entire surface of image sensor 500. Second buffer layer 170 fills recess 510. Second buffer layer 170 fills a portion of recesses 515 not occupied by flicker reduction layer 160. A top surface of second buffer layer 170 is not planar.

Returning to FIG. 4, in operation 445 the second buffer layer is planarized. In some embodiments, the second buffer layer is planarized using a grinding process, a chemical mechanical polishing (CMP) process, an etching process, or the like. Following operation 445 the image sensor resembles image sensor 100 (FIG. 1).

An aspect of this description relates to a method of making an image sensor. The method includes depositing a shield layer over a substrate, wherein the substrate comprises a first photodiode (PD) and a second PD. The method further includes etching the shield layer to define a first recess aligned with the first PD and a second recess aligned with the second PD. The method further includes depositing a flicker reduction layer in the first recess and in the second recess. The method further includes etching the flicker reduction layer to remove the flicker reduction layer from the first recess. In some embodiments, etching the flicker reduction layer includes maintaining a portion of the flicker reduction layer over the shield layer. In some embodiments, maintaining the portion of the flicker reduction layer includes maintaining the portion having a length ranging from about 50 angstroms to about 150 angstroms. In some embodiments, the method further includes depositing a buffer layer in the first recess and the second recess. In some embodiments, depositing the buffer layer includes depositing the buffer layer after etching the flicker reduction layer. In some embodiments, the method further includes forming the first PD in the substrate; and forming the second PD in the substrate, wherein a dimension of the first PD in a first direction parallel to a top surface of the substrate different from a dimension of the second PD in the first direction. In some embodiments, etching the shield layer includes etching the shield layer to define the first recess having a different width than the second recess.

An aspect of this description relates to an image sensor. The image sensor includes a substrate; a first photodiode (PD) having a first size in the substrate; and a second PD having a second size in the substrate, wherein the first size is different from the second size. The image sensor further includes a shield layer, wherein the shield layer defines sidewalls of a first recess aligned with the first PD and sidewalls of a second recess aligned with the second PD. The image sensor further includes a flicker reduction layer in the first recess, wherein the second recess is free of the flicker reduction layer, and the flicker reduction layer extends along a top surface of the shield layer. In some embodiments, the first recess extends through an entirety of the shield layer in a thickness direction. In some embodiments, the image sensor further includes an anti-reflective coating between the first PD and the flicker reduction layer. In some embodiments, an overhang distance of the flicker reduction layer over the shield layer ranges from about 50 angstroms to about 150 angstroms. In some embodiments, the image sensor further includes a buffer layer over the shield layer. In some embodiments, the buffer layer fills the second recess. In some embodiments, the buffer layer directly contacts the shield layer. In some embodiments, the buffer layer directly contacts the flicker reduction layer.

An aspect of this description relates to a method of making an image sensor. The method includes depositing a shield layer over a substrate, wherein the substrate comprises a first photodiode (PD) and a second PD. The method further includes etching the shield layer to define a first recess aligned with the first PD and a second recess aligned with the second PD. The method further includes depositing a flicker reduction layer in the first recess and in the second recess. The method further includes etching the flicker reduction layer to remove the flicker reduction layer to expose a first portion of a top-most surface of the shield layer, wherein an overhang portion of the flicker reduction layer remains over a second portion of the top-most surface of the shield layer after etching the flicker reduction layer. In some embodiments, the method further includes depositing an anti-reflective coating over the substrate, wherein depositing the shield layer comprises depositing the shield layer over the anti-reflective coating. In some embodiments, the method further includes depositing a buffer layer over the flicker reduction layer. In some embodiments, depositing the buffer layer comprise depositing the buffer layer in the first recess. In some embodiments, the method further includes planarizing the buffer layer, wherein a top-most surface of the planarized buffer layer is above a top-most surface of the flicker reduction layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making an image sensor, the method comprising:
   depositing a shield layer over a substrate, wherein the substrate comprises a first photodiode (PD) and a second PD;
   etching the shield layer to define a first recess aligned with the first PD and a second recess aligned with the second PD;
   depositing a flicker reduction layer in the first recess and in the second recess; and
   etching the flicker reduction layer to remove the flicker reduction layer from the first recess.

2. The method of claim 1, wherein etching the flicker reduction layer comprises maintaining a portion of the flicker reduction layer over the shield layer.

3. The method of claim 2, wherein maintaining the portion of the flicker reduction layer comprises maintaining the portion having a length ranging from about 50 angstroms to about 150 angstroms.

4. The method of claim 1, further comprising depositing a buffer layer in the first recess and the second recess.

5. The method of claim 4, wherein depositing the buffer layer comprises depositing the buffer layer after etching the flicker reduction layer.

6. The method of claim 1, further comprising:
   forming the first PD in the substrate; and
   forming the second PD in the substrate, wherein a dimension of the first PD in a first direction parallel to a top surface of the substrate different from a dimension of the second PD in the first direction.

7. The method of claim 1, wherein etching the shield layer comprises etching the shield layer to define the first recess having a different width than the second recess.

8. An image sensor comprising:
   a substrate;
   a first photodiode (PD) having a first size in the substrate;
   a second PD having a second size in the substrate, wherein the first size is different from the second size;
   a shield layer, wherein the shield layer defines sidewalls of a first recess aligned with the first PD and sidewalls of a second recess aligned with the second PD; and
   a flicker reduction layer in the first recess, wherein the second recess is free of the flicker reduction layer, and the flicker reduction layer extends along a top surface of the shield layer.

9. The image sensor of claim 8, wherein the first recess extends through an entirety of the shield layer in a thickness direction.

10. The image sensor of claim 8, further comprising an anti-reflective coating between the first PD and the flicker reduction layer.

11. The image sensor of claim 8, wherein an overhang distance of the flicker reduction layer over the shield layer ranges from about 50 angstroms to about 150 angstroms.

12. The image sensor of claim 8, further comprising a buffer layer over the shield layer.

13. The image sensor of claim 12, wherein the buffer layer fills the second recess.

14. The image sensor of claim 12, wherein the buffer layer directly contacts the shield layer.

15. The image sensor of claim 12, wherein the buffer layer directly contacts the flicker reduction layer.

16. A method of making an image sensor, the method comprising:
 depositing a shield layer over a substrate, wherein the substrate comprises a first photodiode (PD) and a second PD;
 etching the shield layer to define a first recess aligned with the first PD and a second recess aligned with the second PD;
 depositing a flicker reduction layer in the first recess and in the second recess; and
 etching the flicker reduction layer to remove the flicker reduction layer to expose a first portion of a top-most surface of the shield layer, wherein an overhang portion of the flicker reduction layer remains over a second portion of the top-most surface of the shield layer after etching the flicker reduction layer.

17. The method of claim 16, further comprising depositing an anti-reflective coating over the substrate, wherein depositing the shield layer comprises depositing the shield layer over the anti-reflective coating.

18. The method of claim 16, further comprising depositing a buffer layer over the flicker reduction layer.

19. The method of claim 18, wherein depositing the buffer layer comprise depositing the buffer layer in the first recess.

20. The method of claim 18, further comprising planarizing the buffer layer, wherein a top-most surface of the planarized buffer layer is above a top-most surface of the flicker reduction layer.

* * * * *